United States Patent
Choi et al.

(10) Patent No.: US 10,009,166 B2
(45) Date of Patent: Jun. 26, 2018

(54) HYBRID CLOCK DATA RECOVERY CIRCUIT AND RECEIVER

(71) Applicant: SAMSUNG ELECTRONICS CO., LTD., Suwon-si, Gyeonggi-do (KR)

(72) Inventors: Kwang-Chun Choi, Seoul (KR); Jong-Shin Shin, Yongin-si (KR); Sung-Jun Kim, Suwon-si (KR); Hye-Yeon Yang, Suwon-si (KR); Byung-Hyun Lim, Seoul (KR); Woo-Chul Jung, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days. days.

(21) Appl. No.: 15/602,239

(22) Filed: May 23, 2017

(65) Prior Publication Data
US 2018/0152283 A1    May 31, 2018

(30) Foreign Application Priority Data
Nov. 28, 2016   (KR) ......................... 10-2016-0159203

(51) Int. Cl.
| H04L 7/033 | (2006.01) |
| H04L 7/00 | (2006.01) |
| H03L 7/08 | (2006.01) |
| H03L 7/099 | (2006.01) |
| H03L 7/085 | (2006.01) |
| H03K 3/356 | (2006.01) |

(52) U.S. Cl.
CPC ........... *H04L 7/0041* (2013.01); *H03K 3/356* (2013.01); *H03L 7/085* (2013.01); *H03L 7/0807* (2013.01); *H03L 7/0991* (2013.01); *H04L 7/0037* (2013.01); *H04L 7/0087* (2013.01)

(58) Field of Classification Search
CPC ... H04L 7/0041; H04L 7/0037; H04L 7/0087; H03K 3/356; H03L 7/0807; H03L 7/085; H03L 7/0991
See application file for complete search history.

(56) References Cited

U.S. PATENT DOCUMENTS

| 7,092,474 B2 | 8/2006 | Cao |
| 7,315,217 B2 | 1/2008 | Galloway et al. |

(Continued)

*Primary Examiner* — Syed Haider
(74) *Attorney, Agent, or Firm* — F. Chau & Associates, LLC

(57) ABSTRACT

A hybrid clock data recovery circuit includes a linear phase detector configured to generate a recovered data signal by sampling an input data signal in response to a clock signal, and to generate up and down signals having a pulse width difference that is linearly proportional to a phase difference between the input data signal and the clock signal. An arbiter is configured to generate a bang-bang up signal representing that a phase of the input data signal leads a phase of the clock signal and a bang-bang down signal representing that the phase of the clock signal leads the phase of the input data signal based on the up and down signals. A digital loop filter is configured to generate a digital control code based on the bang-bang up and down signals. A digitally controlled oscillator is configured to generate an oscillating frequency of the clock signal in response to the digital control code, and to adjust the oscillating frequency of the clock signal in response to the up and down signals.

20 Claims, 14 Drawing Sheets

(56) References Cited

U.S. PATENT DOCUMENTS

| | | |
|---|---|---|
| 7,764,759 B2 | 7/2010 | Gupta et al. |
| 8,130,888 B2 | 3/2012 | Eldredge et al. |
| 8,699,649 B2 | 4/2014 | Byun |
| 8,948,332 B2 | 2/2015 | Kenney et al. |
| 9,036,764 B1* | 5/2015 | Hossain .................. H03L 7/087 375/355 |
| 9,143,367 B2 | 9/2015 | Aziz et al. |
| 2007/0002993 A1* | 1/2007 | Wang ..................... H03K 3/354 375/374 |
| 2007/0286321 A1* | 12/2007 | Gupta .................... H03L 7/091 375/375 |
| 2011/0267122 A1 | 11/2011 | Jeong et al. |
| 2012/0106689 A1* | 5/2012 | Byun ..................... H03L 7/085 375/374 |
| 2015/0288370 A1* | 10/2015 | Deng .................... H03L 7/0997 327/158 |
| 2016/0013927 A1* | 1/2016 | Lee ........................ H04L 7/033 375/371 |

* cited by examiner

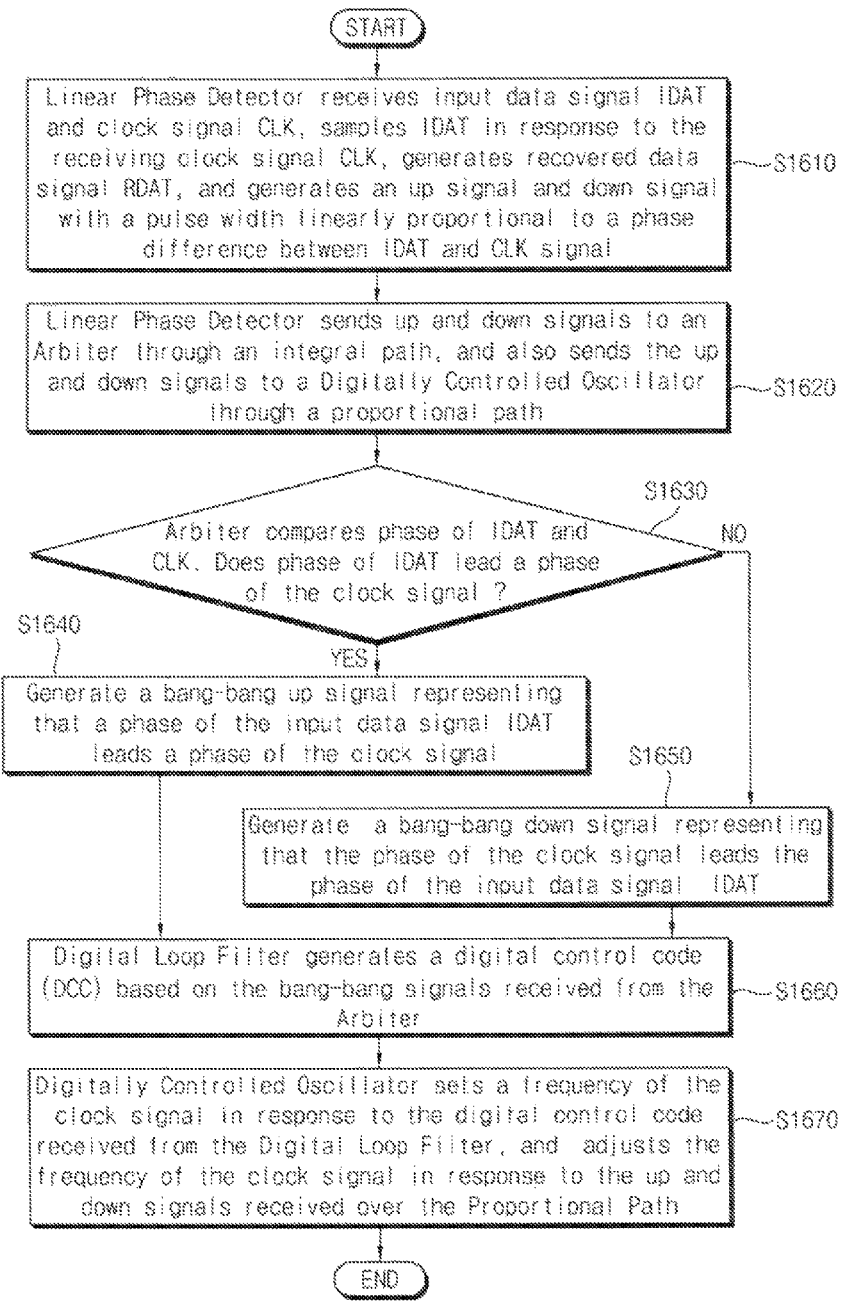

HYBRID CLOCK DATA RECOVERY CIRCUIT AND RECEIVER

CROSS-REFERENCE TO RELATED APPLICATIONS

This U.S. non-provisional application claims the benefit of priority under 35 U.S.C. § 119 from Korean Patent Application No. 10-2016-0159203 filed on Nov. 28, 2016 in the Korean Intellectual Property Office (KIPO), the entire content of which is incorporated by reference herein.

TECHNICAL FIELD

Example embodiments of the present inventive concepts relate to semiconductor devices, and more particularly to hybrid clock data recovery circuits and receivers including the hybrid clock data recovery circuits.

DISCUSSION OF THE RELATED ART

In a conventional receiver, an input data signal may be received at a high speed. A bang-bang type analog clock data recovery (CDR) device including a bang-bang phase detector has been used for high speed data processing. However, as the analog CDR has an analog loop filter that includes a large-sized capacitor, the analog CDR has a large circuit size. A digital CDR including a digital loop filter has seen increased use over the analog CDR. The digital CDR has a lower circuit complexity and a smaller circuit size compared with the analog CDR. However, the digital CDR does not have a linear operation. As a result, the nonlinearity of the digital CDR can adversely impact a jitter performance or a jitter tolerance of a hybrid clock data recovery circuit.

SUMMARY

Some example embodiments of the inventive concept provide a hybrid clock data recovery circuit having an enhanced jitter performance or jitter tolerance by having a substantially linear operation with a relatively low circuit complexity and small circuit size.

Some example embodiments of the inventive concept provide a receiver including a hybrid clock data recovery circuit having an enhanced jitter performance or jitter tolerance by having a substantially linear operation with a relatively low circuit complexity and small circuit size.

According to example embodiments of the inventive concept, a hybrid clock data recovery circuit includes a linear phase detector configured to generate a recovered data signal by sampling an input data signal in response to a clock signal, and to generate up and down signals having a pulse width difference that is linearly proportional to a phase difference between the input data signal and the clock signal, an arbiter that receives the up and down signals generated by the linear phase detector and in response is configured to generate a bang-bang up signal representing that a phase of the input data signal leads a phase of the clock signal and a bang-bang down signal representing that the phase of the clock signal leads the phase of the input data signal based on the up and down signals. A digital loop filter is configured to generate a digital control code based on the bang-bang up and down signals, and a digitally controlled oscillator is configured to determine a frequency (i.e. set an oscillating frequency) of the clock signal in response to the digital control code, and to adjust the determined frequency of the clock signal in response to the up and down signals.

According to example embodiments of the inventive concept, a receiver includes a hybrid clock data recovery circuit configured to generate a clock signal and a recovered data signal based on an input data signal received through a communication channel. The hybrid clock data recovery circuit includes a linear phase detector configured to generate the recovered data signal by sampling the input data signal in response to the clock signal, and to generate up and down signals having a pulse width difference that is linearly proportional to a phase difference between the input data signal and the clock signal, an arbiter configured to generate a bang-bang up signal representing that a phase of the input data signal leads a phase of the clock signal and a bang-bang down signal representing that the phase of the clock signal leads the phase of the input data signal based on the up and down signals, a digital loop filter configured to generate a digital control code based on the bang-bang up and down signals, and a digitally controlled oscillator configured to set a frequency of the clock signal in response to the digital control code, and to adjust the frequency of the clock signal in response to the up and down signals.

In an embodiment of the inventive concept, a hybrid clock data recovery circuit may include a linear phase detector configured to generate a recovered data signal by sampling an input data signal in response to a clock signal, and to generate up and down signals having a pulse width difference that is linearly proportional to a phase difference between the input data signal and the clock signal; an arbiter that receives the up and down signals along an integral path of the hybrid clock data recovery circuit and is configured to generate a bang-bang up signal and a bang-bang down signal; a digital loop filter that receives the bang-bang up and bang-bang down signals from the arbiter along the integral path and generates a digital control code; a digitally controlled oscillator that receives the digital control code from the digital loop filter along the integral path, and receives the up and down signals from the linear phase detector along a proportional path, the digitally controlled oscillator generates an adjusted clock signal having a frequency adjusted to the up and down signals to the linear phase detector.

In an embodiment of the inventive concept, the digitally controlled oscillator generates the adjusted clock signal to have an increased frequency when a value of the digital control code increases, and generates the adjusted clock signal having a decreased frequency when the value of digital control code decreases.

In an embodiment of the inventive concept, the digitally controlled oscillator increases a frequency of the clock signal from a default frequency f0 by an integral path frequency unit change amount α in response to the digital control code being increased by a unit amount.

In an embodiment of the inventive concept, the digitally controlled oscillator increases the frequency the clock signal by a proportional path frequency change amount $f_{BB}$ in response to the up signal having a logic high level and the down signal a logic low level.

The hybrid clock data recovery circuit and the receiver according to the present inventive concept may have a relatively low circuit complexity and small circuit size by employing a digital bang-bang type integral path, and may have a linear operation by employing an analog linear type proportional path that may enhance a jitter performance or a jitter tolerance.

BRIEF DESCRIPTION OF THE DRAWINGS

Illustrative, non-limiting example embodiments of the inventive concept will be better appreciated by a person of ordinary skill in the art from the following detailed description taken in conjunction with the accompanying drawings in which:

FIGS. 16A and 16B are flowcharts illustrating operation of an embodiment of the inventive concept.

DETAILED DESCRIPTION

Figure 1:
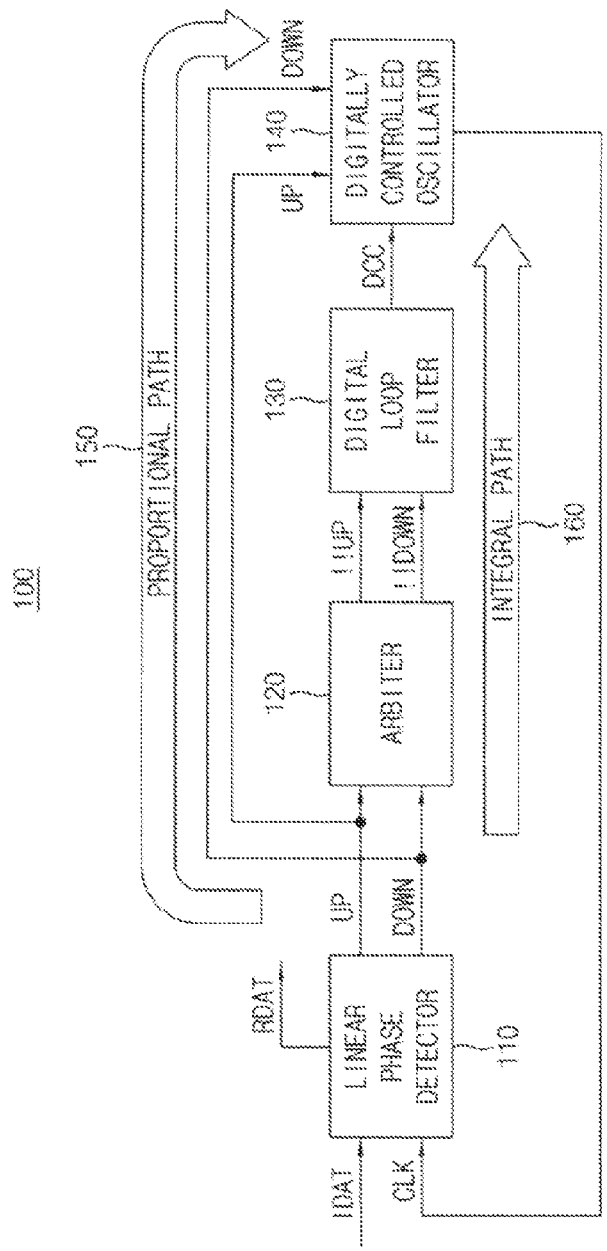
FIG. 1 is a block diagram illustrating a hybrid clock data recovery circuit according to example embodiments of the inventive concept.

FIG. 1 is a block diagram illustrating a hybrid clock data recovery circuit according to example embodiments of the inventive concept.

Referring to FIG. 1, a hybrid clock data recovery circuit 100 may include a linear phase detector 110, an arbiter 120, a digital loop filter 130 and a digitally controlled oscillator 140. FIG. 1 also shows a proportional path 150, and an integral path 160.

The linear phase detector 110 may receive an input data signal IDAT from an external transmitter through a communication channel, and may receive a clock signal CLK generated in the hybrid clock data recovery circuit 100. The linear phase detector 110 may generate a recovered data signal RDAT by sampling the input data signal IDAT in response to the clock signal CLK. In some example embodiments of the inventive concept, the linear phase detector 110 may generate the recovered data signal RDAT, for example, by sampling the input data signal IDAT coinciding with (i.e. occurring at) a rising edge of the clock signal CLK. In other example embodiments, the linear phase detector 110 may generate the recovered data signal RDAT by sampling the input data signal IDAT, for example, coinciding with a falling edge of the clock signal CLK.

The linear phase detector 110 may generate an up signal UP and a down signal DOWN based on the input data signal IDAT and the clock signal CLK. The up signal UP and the down signal DOWN generated by the linear phase detector 110 may have a pulse width difference that is linearly proportional to a phase difference between the input data signal IDAT and the clock signal CLK.

Accordingly, as the phase difference between the input data signal IDAT and the clock signal CLK increases, the pulse width difference between the up signal UP and the down signal DOWN generated by the linear phase detector 110 may be continuously increased. In some example embodiments of the inventive concept, the up signal UP and the down signal DOWN generated by the linear phase detector 110 may be aligned such that the up and down signals UP and DOWN have falling edges aligned with the falling edge of the clock signal CLK, and thus rising edges of the up and down signals UP and DOWN may have a phase difference corresponding to the phase difference between the input data signal IDAT and the clock signal CLK.

In other example embodiments of the inventive concept, the up signal UP and the down signal DOWN generated by the linear phase detector 110 may be aligned such that the up and down signals UP and DOWN have rising edges aligned with the rising edge of the clock signal CLK, and thus falling edges of the up and down signals UP and DOWN may have a phase difference corresponding to the phase difference between the input data signal IDAT and the clock signal CLK.

In addition to the aforementioned discussion regarding the alignment of the up and down signals (UP and DOWN) with the clock signal CLK at rising edges or falling edges, the pulses of the up signal UP and the down signal DOWN may be center-aligned. An artisan should understand and appreciate that the inventive concept is not limited to the above examples, the UP and DOWN signals may be aligned in various ways that are within the ambit of the inventive concept.

The arbiter 120 may generate a bang-bang up signal (!!UP) and a bang-bang down signal (!!DOWN) based on the up signal UP and the down signal DOWN received from the linear phase detector 110. The bang-bang up signal !!UP may have a logic high level may represent that a phase of the input data signal IDAT leads a phase of the clock signal CLK, and the bang-bang down signal !!DOWN having the logic high level may represent that the phase of the clock signal CLK leads the phase of the input data signal IDAT. In some example embodiments, a phase comparison between the input data signal IDAT and the clock signal CLK may be performed between the rising edge of the clock signal CLK and any transition (e.g., any one of a rising edge or a falling edge) of the input data signal IDAT. In other example embodiments, the phase comparison between the input data signal IDAT and the clock signal CLK may be performed between the falling edge of the clock signal CLK and any transition of the input data signal IDAT. The linear phase detector 110 and the arbiter 120 may serve as a bang-bang phase detector, and may have a circuit size similar to that of the bang-bang phase detector.

The digital loop filter 130 may generate a digital control code DCC by digitally filtering the bang-bang up signal !!UP and the bang-bang down signal !!DOWN. In some example embodiments, the digital loop filter 130 may generate the digital control code DCC by accumulating values indicated by the bang-bang up and down signals !!UP and !!DOWN, or based on the values multiplied by a gain.

The digitally controlled oscillator 140 may generate the clock signal CLK having a frequency corresponding to the digital control code DCC. For example, the digitally controlled oscillator 140 may generate the clock signal CLK having a relatively high frequency when the digital control code DCC has a relatively high value, and may generate the clock signal CLK having a relatively low frequency when the digital control code DCC has a relatively low value.

In addition, the digitally controlled oscillator 140 may adjust the frequency of the clock signal CLK in response to the up signal UP and the down signal DOWN received from the linear phase detector 110. The up and down signals may be received via the proportional path 150, whereas the digital control code DCC is received via the integral path 160. With reference to FIG. 1, the integral path 160 may include the arbiter, digital loop filter and digitally controlled oscillator. The proportional path 150 shown in FIG. 1 may include the path from the linear phase detector 110 to the digitally controlled oscillator 140 that excludes the arbiter, and digital loop filter.

The integral path 160 may accumulate output signals from a bang-bang phase detector, which as previously discussed, may be served by the linear phase detector 110 and the arbiter 120. In some example embodiments of the inventive concept, the digitally controlled oscillator 140 may increase the frequency of the clock signal CLK when the up signal UP has a pulse width wider than that of the down signal DOWN, and may decrease the frequency of the clock signal CLK when the down signal DOWN has a pulse width wider than that of the up signal UP. The digitally controlled oscillator 140 may adjust the phase of the clock signal CLK in linear proportion to the phase difference between the input data signal IDAT and the clock signal CLK by adjusting the frequency of the clock signal CLK in response to the up and down signals UP and DOWN. For example, to adjust the phase of the clock signal CLK in linear proportion to the phase difference between the input data signal IDAT and the clock signal CLK, the digitally controlled oscillator 140 may change the frequency of the clock signal CLK for a time period corresponding to the pulse width difference between the up and down signals that is linearly proportional to the phase difference between the input data signal IDAT and the clock signal CLK.

As described above, the hybrid clock data recovery circuit 100 according to example embodiments of the inventive concept may have an integral path 160 of a digital bang-bang type using the arbiter 120 to generate the bang-bang up and bang-bang down signals !!UP and !!DOWN and the digital loop filter 130, and also a proportional path 150 of an analog linear type using the linear phase detector 110 generating the up and down signals UP and DOWN having the pulse width difference that is linearly proportional to the phase difference between the input data signal IDAT and the clock signal CLK. Accordingly, the hybrid clock data recovery circuit 100 according to example embodiments may have not only a low circuit complexity and a small circuit size like a conventional bang-bang type digital clock data recovery circuit, but also the linearity with respect to the proportional path 150, thereby enhancing a jitter performance or a jitter tolerance of the hybrid clock data recovery circuit 100.

In a conventional bang-bang type digital clock data recovery circuit, to have a more stable loop and provide for more tolerance to jitter included in an input data signal, there may be an increase in an amount of a frequency of a clock signal immediately changed by bang-bang up and down signals, or an increase in an amount of frequency change of the clock signal through a proportional path. However, in the conventional bang-bang type digital clock data recovery circuit, if the change in the amount of frequency of the clock signal through the proportional path is increased, a frequency fluctuation of the clock signal also increases, which results in an occurrence of a deterministic jitter. Accordingly, the jitter tolerance of the digital clock data recovery circuit, or in particular, a high-frequency jitter tolerance is worsened.

Thus, to have the linearity in operation associated with the conventional digital clock data recovery circuit, a technique employing a linear phase detector and an analog-to-digital converter instead of the bang-bang phase detector, or a technique employing a plurality of bang-bang phase detectors, etc. may be considered. These techniques may limit an operation speed and a resolution, may have a high circuit complexity, and may increase a circuit size and power consumption due to an addition of the analog-to-digital converter or an additional number of bang-bang phase detectors.

However, the hybrid clock data recovery circuit 100 according to example embodiments of the present inventive concept may perform a frequency control on the clock signal CLK via the proportional path 150 in an analog linear manner (i.e. as in an analog device) using the linear phase detector 110, which results in a substantially linear operation with respect to the proportional path 150. Accordingly, the jitter performance or the jitter tolerance of the hybrid clock data recovery circuit 100 may be enhanced.

Figure 2:
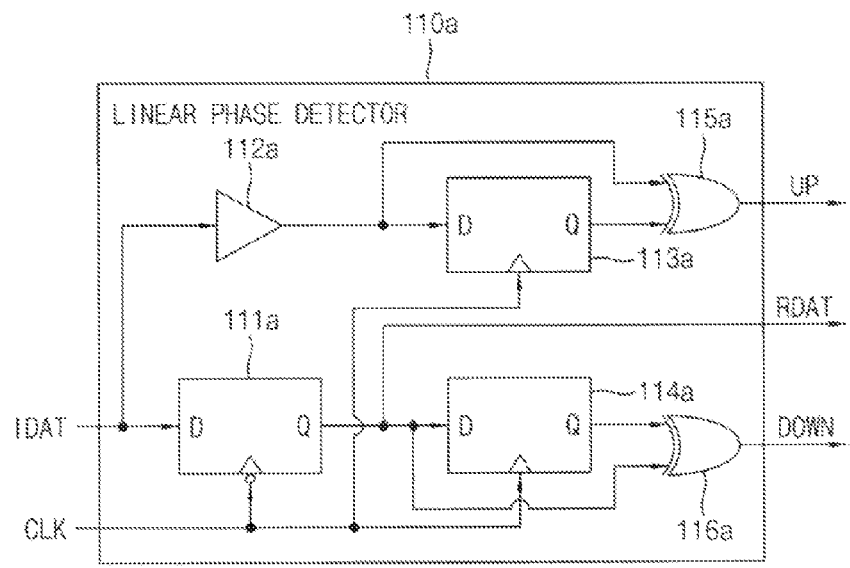
FIG. 2 is a block diagram illustrating a linear phase detector included in a hybrid clock data recovery circuit according to example embodiments of the inventive concept.

FIG. 2 is a block diagram illustrating an example of a linear phase detector included in a hybrid clock data recovery circuit according to example embodiments of the inventive concept.

Referring to FIG. 2, a linear phase detector 110a may include, for example, a first flip-flop 111a, a delayer 112a, a second flip-flop 113a, a third flip-flop 114a, a first XOR gate 115a and a second XOR gate 116a.

More particularly, with regard to the linear phase detector 110a, the first flip-flop 111a may include an input terminal D receiving an input data signal IDAT, and an output terminal Q coupled to an input terminal D of the third flip-flop 114a and a first input terminal of the second XOR gate 116a. The first flip-flop 111a may sample and output the input data signal D at a falling edge of the clock signal CLK. The linear phase detector 110a may output an output signal of the first flip-flop 111a as a recovered data signal RDAT. The delayer 112a may include an input terminal receiving the input data signal IDAT, and an output terminal coupled to an input terminal D of the second flip-flop 113a and a first input terminal of the first XOR gate 115a. The delayer 112a may delay the input data signal IDAT from being provided to the second flip-flop 113a and to the first XOR gate 115a. In some example embodiments, the delayer 112a may delay the input data signal IDAT by a range from about a 0.5 unit interval (UI) to about a 1.5 UI. Here, the UI may correspond to one clock cycle of the clock signal CLK having a default frequency.

The second flip-flop 113a may include an input terminal D coupled to the output terminal of the delayer 112a, and an output terminal Q coupled to a second input terminal of the first XOR gate 115a. In addition, the second flip-flop 113a may sample and output an output signal of the delayer 112a at a rising edge of the clock signal CLK. The third flip-flop 114a may include the input terminal D coupled to the output terminal Q of the first flip-flop 111a, and an output terminal coupled to a second input terminal of the second XOR gate 116a. The third flip-flop 114a may sample and output the output signal of the first flip-flop 111a to the second XOR gate 116a at the rising edge of the clock signal CLK.

With continued reference to FIG. 2, the first XOR gate 115a may include the first input terminal coupled to the output terminal of the delayer 112a, the second terminal coupled to the output terminal Q of the second flip-flop 113a, and an output terminal outputting an up signal UP. The first XOR gate 115a may generate the up signal UP by performing an XOR operation on the output signal of the delayer 112a and an output signal of the second flip-flop 113a. The second XOR gate 116a may include, for example, the first input terminal coupled to the output terminal Q of the first flip-flop 111a, the second input terminal coupled to the output terminal Q of the third flip-flop 114a, and an output terminal outputting a down signal DOWN. The second XOR gate 116a may generate the down signal DOWN by performing an XOR operation on the output signal of the first flip-flop 111a and an output signal of the third flip-flop 114a.

The linear phase detector 110a of FIG. 2 may generate the recovered data signal RDAT by sampling the input data signal IDAT at the falling edge of the clock signal CLK. Further, the linear phase detector 110a of FIG. 2 may generate the up and down signals UP and DOWN such that the up and down signals UP and DOWN have falling edges coinciding with the falling edge of the clock signal CLK and rising edges of which a phase difference corresponds to a phase difference between the input data signal IDAT and the clock signal CLK.

Figure 3:
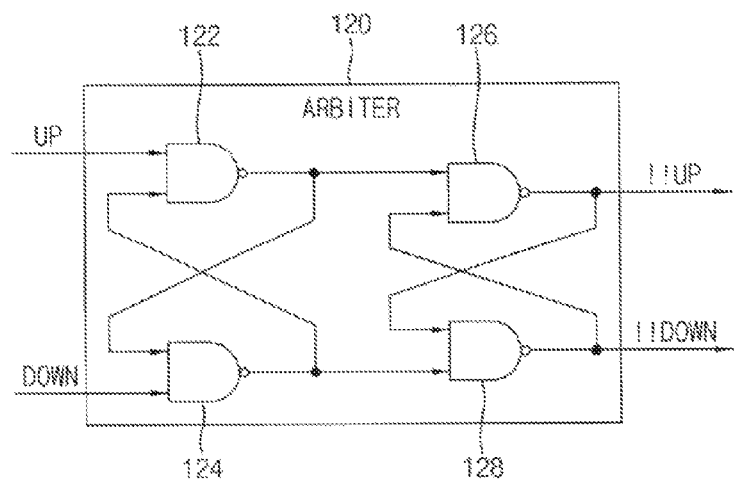
FIG. 3 is a block diagram illustrating an arbiter included in a hybrid clock data recovery circuit according to example embodiments of the inventive concept.

FIG. 3 is a block diagram illustrating an example of an arbiter included in a hybrid clock data recovery circuit according to example embodiments of the inventive concept.

Referring to FIG. 3, an arbiter 120 may include first through fourth NAND gates 122, 124, 126 and 128.

The first NAND gate 122 may include a first input terminal receiving an up signal UP, a second input terminal coupled to an output terminal of the second NAND gate 124, and an output terminal coupled to a first input terminal of the third NAND gate 126. The first NAND gate 122 may perform a NAND operation on the up signal UP and an output signal of the second NAND gate 124. The second NAND gate 124 may include a first input terminal receiving a down signal DOWN, a second input terminal coupled to the output terminal of the first NAND gate 122, and the output terminal coupled to a first input terminal of the fourth NAND gate 128. The second NAND gate 124 may perform a NAND operation on the down signal DOWN and an output signal of the first NAND gate 122.

The third NAND gate 126 may include the first input terminal coupled to the output terminal of the first NAND gate 122, a second input terminal coupled to an output terminal of the fourth NAND gate 128, and an output terminal outputting a bang-bang up signal !!UP. The third NAND gate 126 may generate the bang-bang up signal !!UP by performing a NAND operation on the output signal of the first NAND gate 122 and an output signal of a fourth NAND gate 128. The fourth NAND gate 128 may include the first input terminal coupled to the output terminal of the second NAND gate 124, a second input terminal coupled to the output terminal of the third NAND gate 126, and the output terminal outputting a bang-bang down signal !!DOWN. The fourth NAND gate 128 may generate the bang-bang down signal !!DOWN by performing a NAND operation on the output signal of the second NAND gate 124 and an output signal of the third NAND gate 126.

The arbiter 120 of FIG. 3 may generate the bang-bang up signal !!UP having a logic high level and the bang-bang down signal !!DOWN having a logic low level while the up signal UP has a pulse width wider than that of the down signal DOWN. Thus, the arbiter 120 may generate the bang-bang up signal !!UP having the logic high level and the bang-bang down signal !!DOWN having the logic low level while a phase of an input data signal leads a phase of a clock signal. Further, the arbiter 120 of FIG. 3 may generate the bang-bang up signal !!UP having the logic low level and the bang-bang down signal !!DOWN having the logic high level while the down signal DOWN has a pulse width wider than that of the up signal UP. Thus, the arbiter 120 may generate the bang-bang up signal !!UP having the logic low level and the bang-bang down signal !!DOWN having the logic high level while the phase of the clock signal leads the phase of the input data signal.

In some example embodiments of the inventive concept, in a case where the up and down signals UP and DOWN are aligned such that the up and down signals UP and DOWN have falling edges occurring at (i.e. coinciding with) a falling edge of the clock signal, the arbiter 1200 may detect which one of rising edges of the up and down signals UP and DOWN leads the other of the rising edges, may generate the bang-bang up signal !!UP having the logic high level when the rising edge of the up signal UP leads the rising edge of the down signal DOWN, and may generate the bang-bang down signal !!DOWN having the logic high level when the rising edge of the down signal DOWN leads the rising edge of the up signal UP.

Although FIG. 3 illustrates an example of the arbiter 120 including two latches, or the four NAND gates 122, 124, 126 and 128, the arbiter 120 according to example embodiments of the inventive concept is not limited to the example illustrated in FIG. 3, and may have various configurations. For example, the arbiter 120 may be implemented with four NOR gates.

Figure 4:
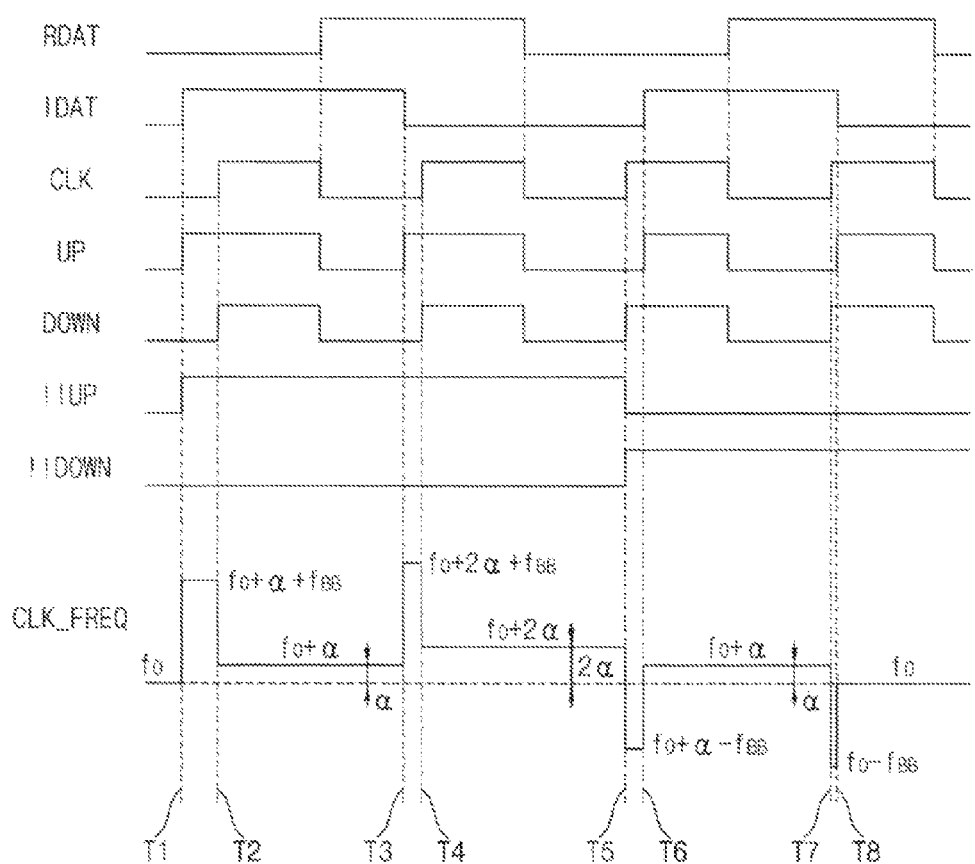
FIG. 4 is a timing diagram describing an operation of a hybrid clock data recovery circuit according to example embodiments of the inventive concept.

FIG. 4 is a timing diagram for describing an operation of a hybrid clock data recovery circuit according to example embodiments.

Referring to FIGS. 1 through 4, at a first time point T1 (FIG. 4) when an input data signal IDAT transitions (from low to high) before a rising edge of a clock signal CLK occurs, a linear phase detector 110 and 110a may generate an up signal UP having a rising edge. An arbiter 120 may generate a bang-bang up signal !!UP having a rising edge and a bang-bang down signal !!DOWN having a logic low level in response to the up signal UP having the rising edge and a down signal DOWN having a logic low level. A digital loop filter 130 may increase a digital control code DCC by a unit amount (e.g., by 1) in response to the bang-bang up signal !!UP having a logic high level, and a digitally controlled oscillator 140 may increase a frequency CLK_FREQ of the clock signal CLK from a default frequency f0 by an integral path frequency unit change amount α in response to the digital control code DCC increased by the unit amount. In addition, the digitally controlled oscillator 140 may further increase the frequency CLK_FREQ of the clock signal CLK by a proportional path frequency change amount $f_{BB}$ in response to the up signal UP having the logic high level and the down signal DOWN having the logic low level. The integral path frequency unit change amount α and the proportional path frequency change amount $f_{BB}$ may be set or predetermined suitably for applications according to example embodiments of the inventive concept.

At a second time point T2 when the clock signal CLK has a rising edge, the linear phase detector 110 and 110*a* may generate the down signal DOWN having a rising edge. The digitally controlled oscillator 140 may remove the increment (corresponding to the proportional path frequency change amount $f_{BB}$) of the frequency CLK_FREQ of the clock signal CLK, or may decrease the frequency CLK_FREQ of the clock signal CLK by the proportional path frequency change amount $f_{BB}$ in response to the up signal UP having the logic high level and the down signal DOWN having the logic high level. For example, in a case where the up signal UP has a pulse width wider than that of the down signal DOWN (T1 and T2), the digitally controlled oscillator 140 may increase the frequency CLK_FREQ of the clock signal CLK by the proportional path frequency change amount $f_{BB}$ for a time period (from T1 to T2) corresponding to a pulse width difference between the up signal UP and the down signal DOWN.

With continued reference to FIG. 4, at a falling edge of the clock signal CLK, the linear phase detector 110 and 110*a* may generate a recovered data signal RDAT by sampling the input data signal IDAT. Further, at the falling edge of the clock signal CLK, the linear phase detector 110 and 110*a* may generate the up signal UP having a falling edge and the down signal DOWN having a falling edge.

At a third time point T3 when the input data signal IDAT transitions, the linear phase detector 110 and 110*a* may generate an up signal UP having a rising edge. The arbiter 120 may generate the bang-bang up signal !!UP having the logic high level and the bang-bang down signal !!DOWN having the logic low level while a phase of the input data signal IDAT leads a phase of the clock signal CLK, or while the up signal UP has the pulse width wider than that of the down signal DOWN. The digital loop filter 130 may further increase the digital control code DCC by the unit amount in response to the bang-bang up signal !!UP having the logic high level, and the digitally controlled oscillator 140 may further increase the frequency CLK_FREQ of the clock signal CLK by the integral path frequency unit change amount α. Further, the digitally controlled oscillator 140 may increase the frequency CLK_FREQ of the clock signal CLK by the proportional path frequency change amount $f_{BB}$ in response to the up signal UP having the logic high level and the down signal DOWN having the logic low level.

With continued reference to FIG. 4, at a fourth time point T4 when the clock signal CLK has a rising edge, the linear phase detector 110 and 110*a* may generate the down signal DOWN having a rising edge, and the digitally controlled oscillator 140 may remove the increment (corresponding to the proportional path frequency change amount $f_{BB}$) of the frequency CLK_FREQ of the clock signal CLK.

At a fifth time point T5 when the clock signal CLK has a rising edge before the input data signal IDAT transitions (a phase of the clock signal CLK leads the phase of the IDAT), the linear phase detector 110 and 110*a* may generate the down signal DOWN having a rising edge. The arbiter 120 may generate the bang-bang up signal !!UP having a logic low level and the bang-bang down signal !!DOWN having a rising edge in response to the up signal UP having a logic low level and the down signal DOWN having the rising edge. The digital loop filter 130 may decrease the digital control code DCC by the unit amount in response to the bang-bang down signal !!DOWN having a logic high level, and the digitally controlled oscillator 140 may decrease the frequency CLK_FREQ of the clock signal CLK by the integral path frequency unit change amount α in response to the digital control code DCC decreased by the unit amount. The digitally controlled oscillator 140 may further decrease the frequency CLK_FREQ of the clock signal CLK by the proportional path frequency change amount $f_{BB}$ in response to the up signal UP having the logic low level and the down signal DOWN having the logic high level.

At a sixth time point T6 when the input data signal IDAT transitions, the linear phase detector 110 and 110*a* may generate the up signal UP having a rising edge. The digitally controlled oscillator 140 may remove the decrement (corresponding to the proportional path frequency change amount $f_{BB}$) of the frequency CLK_FREQ of the clock signal CLK, or may increase the frequency CLK_FREQ of the clock signal CLK by the proportional path frequency change amount $f_{BB}$ in response to the up signal UP having the logic high level and the down signal DOWN having the logic high level. For example, in a case where the down signal DOWN has a pulse width wider than that of the up signal UP (as shown at T6 comparing the UP signal and the DOWN signal), the digitally controlled oscillator 140 may decrease the frequency CLK_FREQ of the clock signal CLK by the proportional path frequency change amount $f_{BB}$ for a time period (from T5 to T6) corresponding to a pulse width difference between the up signal UP and the down signal DOWN.

At a seventh time point T7 when the clock signal CLK has a rising edge, the linear phase detector 110 and 110*a* may generate the down signal DOWN having a rising edge. The arbiter 120 may generate the bang-bang up signal !!UP having the logic low level and the bang-bang down signal !!DOWN having the logic high level while the phase of the clock signal CLK leads the phase of the input data signal IDAT, or while the down signal DOWN has a pulse width wider than that of the up signal UP. The digital loop filter 130 may further decrease the digital control code DCC by the unit amount in response to the bang-bang down signal !!DOWN having the logic high level, and the digitally controlled oscillator 140 may further decrease the frequency CLK_FREQ of the clock signal CLK by the integral path frequency unit change amount α. Further, the digitally controlled oscillator 140 may decrease the frequency CLK_FREQ of the clock signal CLK by the proportional path frequency change amount $f_{BB}$ in response to the up signal UP having the logic low level and the down signal DOWN having the logic high level.

At an eighth time point T8 when the input data signal IDAT transitions, the linear phase detector 110 and 110*a* may generate the up signal UP having a rising edge, and the digitally controlled oscillator 140 may remove the decrement (corresponding to the proportional path frequency change amount $f_{BB}$) of the frequency CLK_FREQ of the clock signal CLK.

As described above, the hybrid clock data recovery circuit 100 according to example embodiments of the inventive concept may control the frequency CLK_FREQ of the clock signal CLK via an integral path 160 in a digital bang-bang manner. Further, the hybrid clock data recovery circuit 100 according to example embodiments may adjust the phase of the clock signal CLK in linear proportion to a phase difference between the input data signal IDAT and the clock signal CLK by changing the frequency CLK_FREQ of the clock signal CLK by the proportional path frequency change amount $f_{BB}$ for the time period (from T1 to T2, from T3 to T4, from T5 to T6, or from T7 to T8) corresponding to the phase difference between the input data signal IDAT and the clock signal CLK. Thus, the hybrid clock data recovery circuit 100 according to example embodiments of the inventive concept may further perform the frequency control of the clock signal CLK via a proportional path 150 in an analog linear manner using the linear phase detector 110 and 110a, and thus may have a linearity with respect to the proportional path 150, thereby enhancing a jitter performance or a jitter tolerance.

Figure 5:
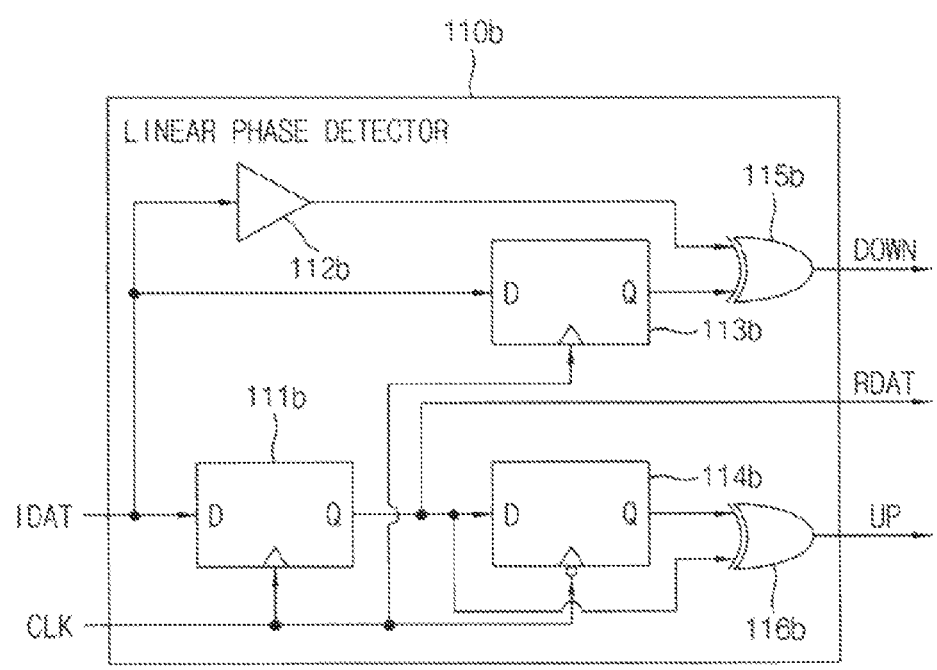
FIG. 5 is a block diagram illustrating a linear phase detector included in a hybrid clock data recovery circuit according to example embodiments of the inventive concept.

FIG. 5 is a block diagram illustrating an example of a linear phase detector included in a hybrid clock data recovery circuit according to example embodiments of the inventive concept.

Referring to FIG. 5, a linear phase detector 110b may include a first flip-flop 111b, a delayer 112b, a second flip-flop 113b, a third flip-flop 114b, a first XOR gate 115b and a second XOR gate 116b.

The first flip-flop 111b may sample and output an input data signal IDAT at a rising edge of a clock signal CLK. The delayer 112b may delay the input data signal IDAT, for example, by a range from about 0.5 UI to about 1.5 UI. The second flip-flop 113b may sample and output the input data signal IDAT at the rising edge of the clock signal CLK. The third flip-flop 114b may sample and output an output signal of the first flip-flop 111b at a falling edge of the clock signal CLK. The first XOR gate 115b may generate a down signal DOWN by performing an XOR operation on an output signal from the delayer 112b and an output signal from the second flip-flop 113b. The second XOR gate 116b may generate an up signal UP by performing an XOR operation on the output signal of the first flip-flop 111b and an output signal of the third flip-flop 114b.

The linear phase detector 110b of FIG. 5 may generate a recovered data signal RDAT by sampling the input data signal IDAT at the rising edge of the clock signal CLK. Further, the linear phase detector 110b of FIG. 5 may generate the up and down signals UP and DOWN such that the up and down signals UP and DOWN have rising edges at the rising edge of the clock signal CLK and falling edges of which a phase difference corresponds to a phase difference between the input data signal IDAT and the clock signal CLK.

Although FIGS. 2 and 5 illustrate examples of a configuration of the linear phase detector 110a and 110b, the linear phase detector 110 according to the inventive concept is not limited to the examples shown and described herein, and may be implemented with various configurations.

Figure 6:
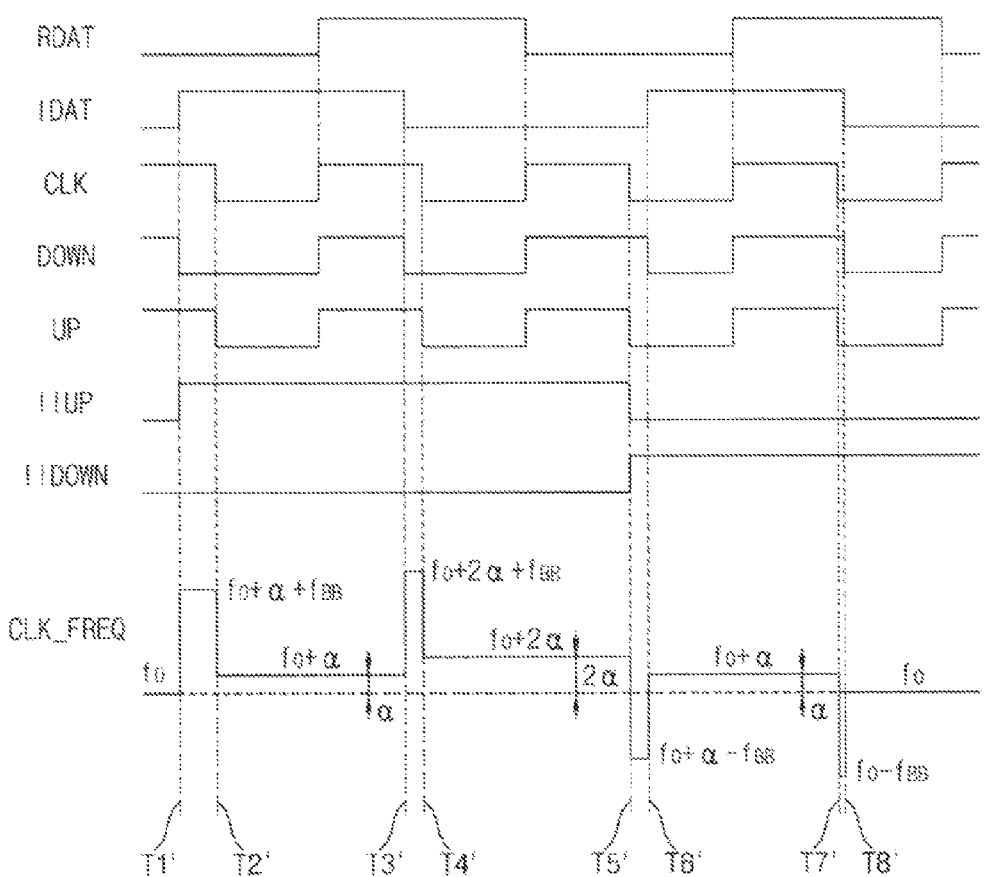
FIG. 6 is a timing diagram describing an operation of a hybrid clock data recovery circuit according to example embodiments of the inventive concept.

FIG. 6 is a timing diagram for describing an operation of a hybrid clock data recovery circuit according to example embodiments of the inventive concept.

Referring to FIGS. 1, 3, 5 and 6, a person of ordinary skill in the art should understand and appreciate that unlike the up and down signals UP and DOWN having falling edges at a falling edge of a clock signal CLK as illustrated in FIG. 4, up and down signals UP and DOWN generated by a linear phase detector 110b of FIG. 5 may have rising edges at a rising edge of the clock signal CLK as illustrated in FIG. 6.

For example, the linear phase detector 110 and 110b may generate the down signal DOWN having the rising edge coincide with the rising edge of the clock signal CLK and a falling edge when an input data signal IDAT transitions, and the up signal UP having the rising edge coincide with the rising edge of the clock signal CLK and a falling edge at the falling edge of the clock signal CLK.

An arbiter 120 may generate a bang-bang up signal !!UP having a logic high level and a bang-bang down signal !!DOWN having a logic low level while a phase of the input data signal IDAT leads a phase of the clock signal CLK, or while the up signal UP has a pulse width wider than that of the down signal DOWN. Further, the arbiter 120 may generate the bang-bang up signal !!UP having the logic low level and the bang-bang down signal !!DOWN having the logic high level while the phase of the clock signal CLK leads the phase of the input data signal IDAT, or while the down signal DOWN has a pulse width wider than that of the up signal UP.

A digital loop filter 130 may increase a digital control code DCC by a unit amount in response to the bang-bang up signal !!UP having the logic high level, and a digitally controlled oscillator 140 may increase a frequency CLK_FREQ of the clock signal CLK by an integral path frequency unit change amount α. Further, the digital loop filter 130 may decrease the digital control code DCC by the unit amount in response to the bang-bang down signal !!DOWN having the logic high level, and the digitally controlled oscillator 140 may decrease the frequency CLK_FREQ of the clock signal CLK by the integral path frequency unit change amount α.

In addition, in a case where the up signal UP has the pulse width wider than that of the down signal DOWN, the digitally controlled oscillator 140 may increase the frequency CLK_FREQ of the clock signal CLK by a proportional path frequency change amount $f_{BB}$ for a time period (from T1' to T2' or from T3' to T4') corresponding to a pulse width difference between the up and down signals UP and DOWN. On the other hand, in a case where the down signal DOWN has the pulse width wider than that of the up signal UP, the digitally controlled oscillator 140 may decrease the frequency CLK_FREQ of the clock signal CLK by the proportional path frequency change amount $f_{BB}$ for a time period (from T5' to T6' or from T7' to T8') corresponding to the pulse width difference between the up and down signals UP and DOWN.

Figure 7:
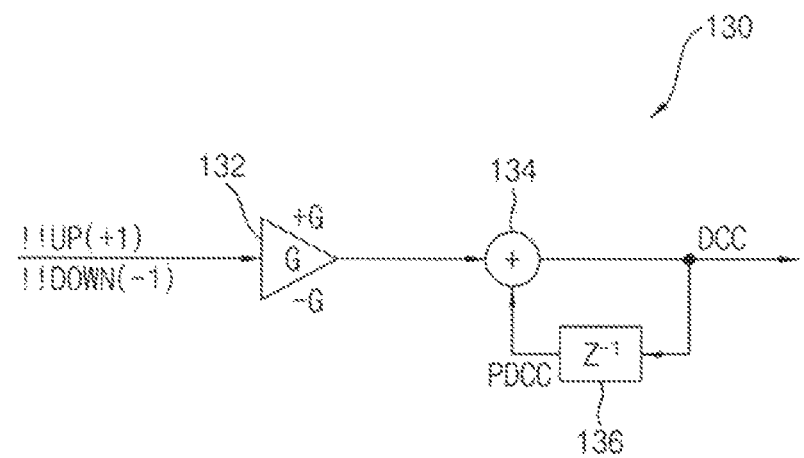
FIG. 7 is a block diagram illustrating a digital loop filter included in a hybrid clock data recovery circuit according to example embodiments of the inventive concept.

FIG. 7 is a block diagram illustrating an example of a digital loop filter included in a hybrid clock data recovery circuit according to example embodiments of the inventive concept.

A digital loop filter 130 may generate a digital control code DCC by digitally filtering a bang-bang up signal !!UP and a bang-bang down signal !!DOWN. Referring to FIG. 7, the digital loop filter 130 may include a digital multiplier 132, a digital adder 134 and a digital delay block 136. The digital multiplier 132 may multiply a value indicated by the bang-bang up and down signals !!UP and !!DOWN by a gain G, and may output the value multiplied by the gain G. In an example illustrated in FIG. 7, the bang-bang up signal !!UP having a logic high level may represent '+1', the bang-bang down signal !!DOWN having a logic high level may represent '−1', and the gain G may be any value. In this case, the digital multiplier 132 may output '+G' when the bang-bang up signal !!UP having the logic high level is applied, and may output '−G' when the bang-bang down signal !!DOWN having the logic high level is applied. The digital delay block 136 may delay the output of the digital control code DCC, and may output the delayed digital control code DCC as a previous digital control code PDCC. The digital adder 134 may add an output of the digital multiplier 132 to the previous digital control code PDCC, and may output a result of the addition as the digital control code DCC.

Although FIG. 7 illustrates an example of a configuration of the digital loop filter 130, a person of ordinary skill in the art should understand and appreciate that the digital loop filter 130 according to example embodiments of the inventive concept is not limited to the example shown and described, and may be implemented with various configurations.

FIGS. 8 through 11 are block diagrams illustrating example of a digitally controlled oscillator included in a hybrid clock data recovery circuit according to example embodiments of the inventive concept.

Figure 8:
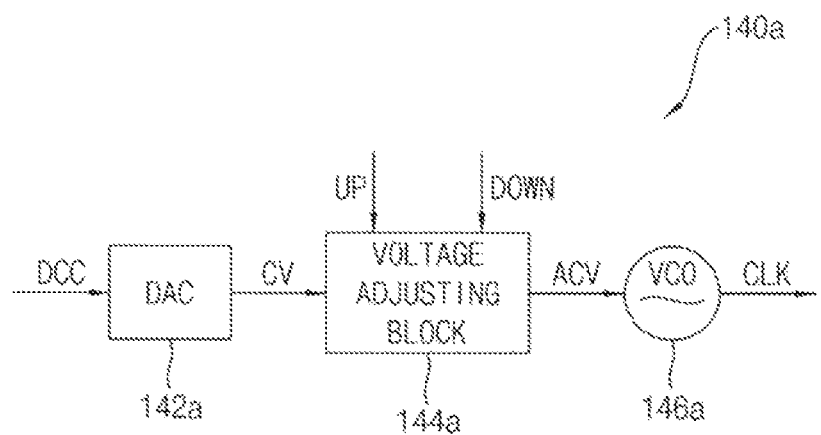
FIG. 8 is a block diagram illustrating a digitally controlled oscillator included in a hybrid clock data recovery circuit according to example embodiments of the inventive concept.

Referring to FIG. 8, a digitally controlled oscillator 140a may include a digital-to-analog converter 142a that converts a digital control code DCC into an analog control voltage CV, a voltage adjusting block 144a that adjusts the control voltage CV in response to up and down signals UP and DOWN, and a voltage controlled oscillator (VCO) 146a that generates a clock signal CLK having a frequency corresponding to the adjusted control voltage ACV. The digitally controlled oscillator 140a may adjust the control voltage CV in response to the up and down signals UP and DOWN to change the frequency of the clock signal CLK by a proportional path frequency change amount for a time period corresponding to a pulse width difference between the up and down signals UP and DOWN.

Figure 9:
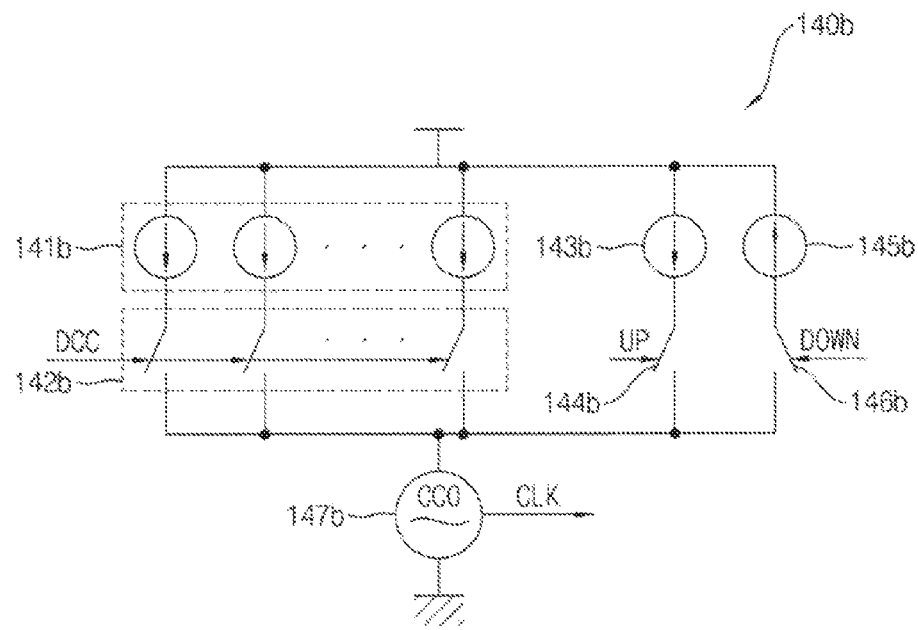
FIG. 9 is a block diagram illustrating a digitally controlled oscillator included in a hybrid clock data recovery circuit according to example embodiments of the inventive concept.

Referring to FIG. 9, a digitally controlled oscillator 140b may include a current source array 141b including a plurality of current sources, a switch array 142b that selectively connects the plurality of current sources from the current source array 141b to generate a control current corresponding to a digital control code DCC, an up current source 143b that generates an addition current, an up switch 144b that connects the up current source 143b such that the addition current is added to the control current in response to an up signal UP, a down current source 145b that generates a subtraction current, a down switch 146b that connects the down current source 145b such that the subtraction current is subtracted from the control current in response to a down signal DOWN, and a current controlled oscillator (CCO) 147b that generates a clock signal CLK having a frequency corresponding to a current applied through the switch array 142b, the up switch 144b and the down switch 146b. In addition, to change the frequency of the clock signal CLK by a proportional path frequency change amount for a time period corresponding to a pulse width difference between the up and down signals UP and DOWN, the digitally controlled oscillator 140b may increase the current applied to the CCO 147b by the addition current of the up current source 143b in response to the up signal UP and may decrease the current applied to the CCO 147b by the subtraction current of the down current source 145b in response to the down signal DOWN.

Figure 10:
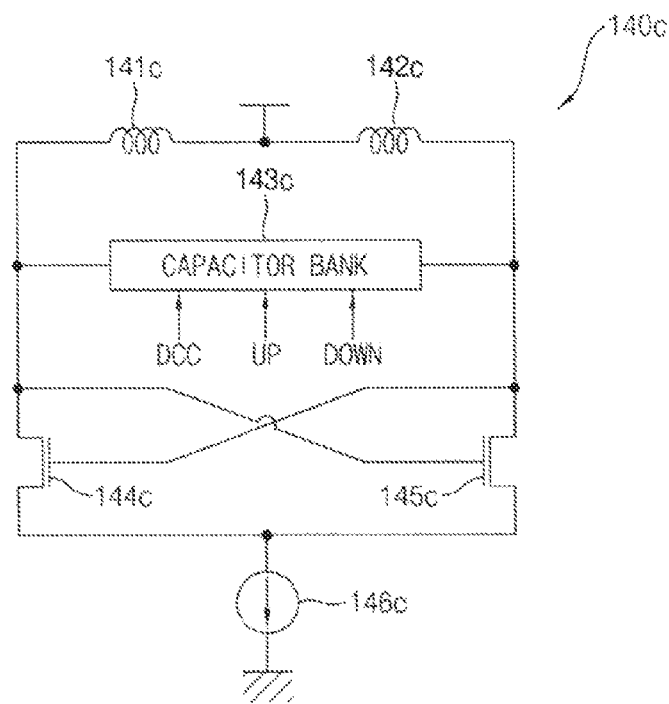
FIG. 10 is a block diagram illustrating a digitally controlled oscillator included in a hybrid clock data recovery circuit according to example embodiments of the inventive concept.

Referring to FIG. 10, a digitally controlled oscillator 140c may be, for example, an LC oscillator including at least one inductor 141c and 142c and a capacitor bank 143c. The digitally controlled oscillator 140c may further include transistors 144c and 145c and a current source 146c. A capacitance of the capacitor bank 143c may be adjusted in response to a digital control code DCC, and may also be adjusted in response to up and down signals UP and DOWN. The digitally controlled oscillator 140c may adjust the capacitance of the capacitor bank 143c in response to the up and down signals UP and DOWN to change the frequency of the clock signal CLK by a proportional path frequency change amount for a time period corresponding to a pulse width difference between the up and down signals UP and DOWN.

Figure 11:
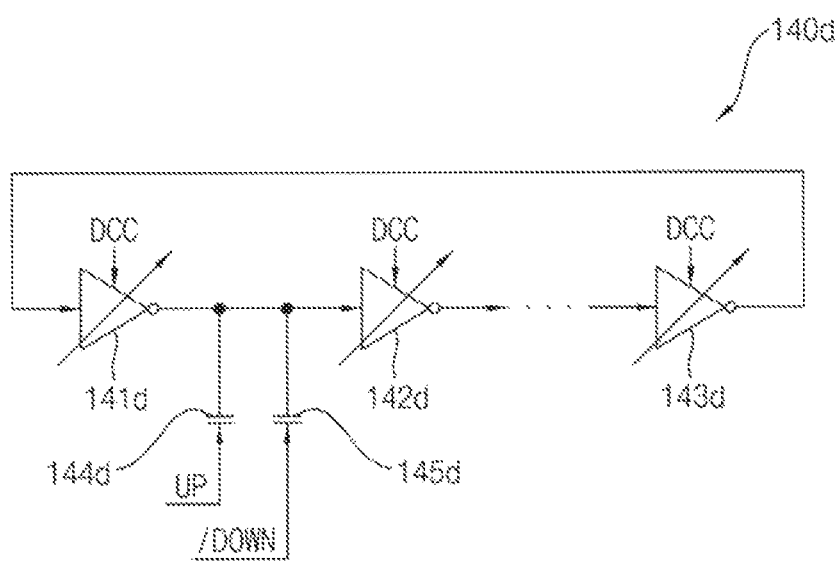
FIG. 11 is a block diagram illustrating a digitally controlled oscillator included in a hybrid clock data recovery circuit according to example embodiments of the inventive concept.

Referring to FIG. 11, a digitally controlled oscillator 140d may be, for example, a ring oscillator including at least one inverter 141d, 142d and 143d of which a delay amount is adjusted in response to a digital control code DCC. The digitally controlled oscillator 140d may further include a first voltage controlled capacitor (or a first varactor) 144d of which a capacitance is adjusted in response to an up signal UP, and a second voltage controlled capacitor (or a second varactor) 145d of which a capacitance is adjusted in response to a down signal DOWN. For example, when the up signal UP having a logic high level is applied, the capacitance of the first voltage controlled capacitor 144d may be decreased, and a frequency of a clock signal generated by the digitally controlled oscillator 140d may be increased by a proportional path frequency change amount. When the down signal DOWN having a logic high level is applied, the capacitance of the second voltage controlled capacitor 145d may be increased, and the frequency of the clock signal generated by the digitally controlled oscillator 140d may be decreased by the proportional path frequency change amount. Accordingly, the digitally controlled oscillator 140d may change the frequency of the clock signal CLK by the proportional path frequency change amount for a time period corresponding to a pulse width difference between the up and down signals UP and DOWN.

Although FIGS. 8 through 11 illustrate examples of a configuration of the digitally controlled oscillator 140a, 140b, 140c and 140d, a person of ordinary skill in the art should under and appreciate that the digitally controlled oscillator 140 according to the inventive concept is not limited to the example embodiments shown and described herein, and may be implemented with various configurations.

Figure 12:
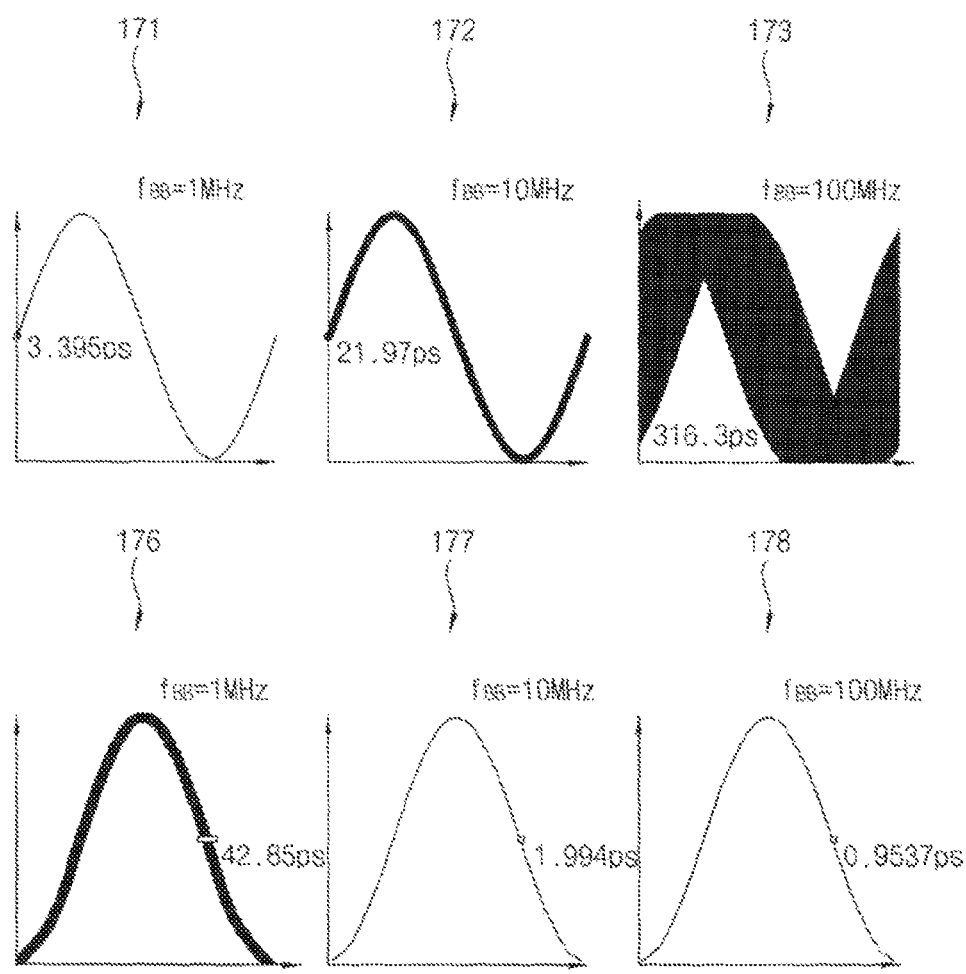
FIG. 12 graphically illustrates clock signals recovered by a conventional digital clock data recovery circuit and clock signals recovered by a hybrid clock data recovery circuit according to example embodiments of the inventive concept.

FIG. 12 graphically illustrates clock signals recovered by a conventional digital clock data recovery circuit and also graphically illustrates clock signals recovered by a hybrid clock data recovery circuit according to example embodiments of the inventive concept.

In FIG. 12, graphs 171, 172 and 173 represent clock signals generated or recovered by a conventional digital clock data recovery circuit including a bang-bang phase detector when an ideal pseudorandom binary sequence (PRBS) pattern of a Gb/s is applied as an input data signal, a gain of an integral path is 0.11, and a proportional path frequency change amount $f_{BB}$ is 1 MHz, 10 MHz and 100 MHz, respectively. As illustrated in the graphs 171, 172 and 173, the clock signals recovered by the conventional digital clock data recovery circuit may have jitters of about 3.395 ps, about 21.97 ps and about 316.3 ps, respectively.

In addition, FIG. 12 also shows graphs 176, 177 and 178 that represent clock signals generated or recovered by a hybrid clock data recovery circuit including a linear phase detector according to example embodiments of the inventive concept under the same conditions described above. As illustrated in the graphs 176, 177 and 178, the clock signals recovered by the hybrid clock data recovery circuit may have jitters of about 42.85 ps, about 1.994 ps and about 0.9537 ps, respectively. As illustrated in FIG. 12, even if the input data signal is the ideal signal without jitter, the clock signal recovered by the conventional digital clock data recovery circuit including the bang-bang phase detector may have jitter that increases as the proportional path frequency change amount $f_{BB}$ increases. However, the hybrid clock data recovery circuit including the linear phase detector according to example embodiments of the inventive concept may recover the clock signal with small jitter even if the proportional path frequency change amount $f_{BB}$ is increased.

Figure 13:
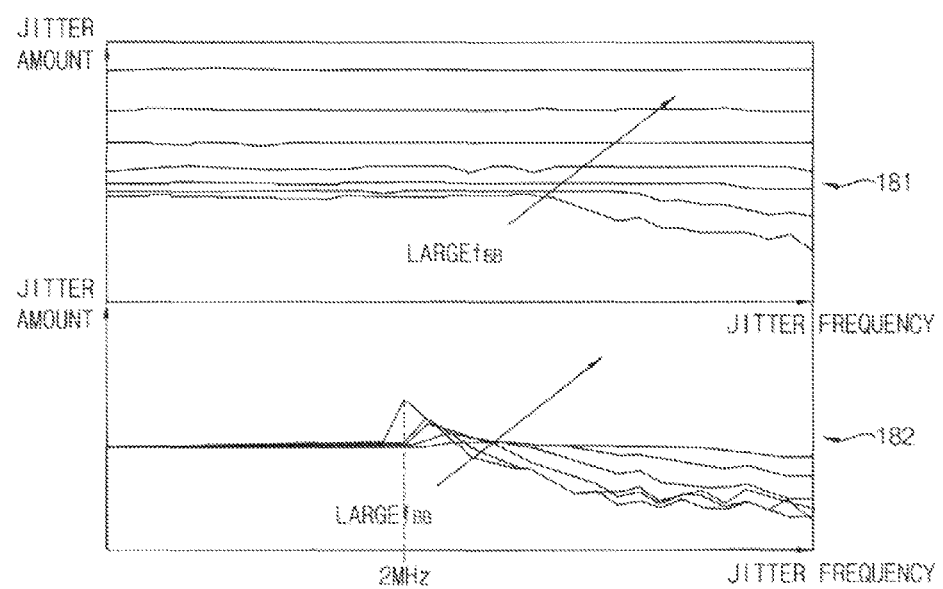
FIG. 13 graphically illustrates a jitter transfer function of a conventional digital clock data recovery circuit and a jitter transfer function of a hybrid clock data recovery circuit according to example embodiments of the inventive concept.

FIG. 13 graphically illustrates a jitter transfer function of a conventional digital clock data recovery circuit and also graphically illustrates a jitter transfer function of a hybrid clock data recovery circuit according to example embodiments of the inventive concept.

In FIG. 13, a graph 181 illustrates a jitter transfer function of a conventional digital clock data recovery circuit including a bang-bang phase detector (BBPD-DCDR) as a proportional path frequency change amount $f_{BB}$ increases when an input data signal has a sinusoidal jitter of 0.04 UI (e.g., 40 ps). As illustrated in the graph 181, in the BBPD-DCDR, as the proportional path frequency change amount $f_{BB}$ increases, a loop bandwidth may increase, but a jitter generated autonomously by the BBPD-DCDR may also increase. A graph 182 illustrates a jitter transfer function of a hybrid clock data recovery circuit including a linear phase detector (LDC-HCDR) according to example embodiments of the inventive concept as the proportional path frequency change amount $f_{BB}$ increases under the same condition. As illustrated in the graph 182, in the LDC-HCDR according to example embodiments, as the proportional path frequency change amount $f_{BB}$ increases, the loop bandwidth may increase while the jitter is not increased. However, in the graph 182, the jitter transfer function of the LDC-HCDR having a small proportional path frequency change amount $f_{BB}$ may have a jitter peak near about 2 MHz. This is because the LDC-HCDR having the small proportional path frequency change amount $f_{BB}$ may have a relatively small effective proportional path gain compared with the BBPD-DCDR having the same small proportional path frequency change amount $f_{BB}$, and thus may have an insufficient phase margin. However, in designing the LDC-HCDR, the proportional path frequency change amount $f_{BB}$ may be increased, and thus the jitter peak of the LDC-HCDR having the small proportional path frequency change amount $f_{BB}$ does not matter. Referring to FIG. 13, as the proportional path frequency change amount $f_{BB}$ increases, a jitter is increased in the BBPD-DCDR. However, in the LDC-HCDR according to example embodiments, the jitter may not be increased even if the proportional path frequency change amount $f_{BB}$ is increased.

Figure 14:
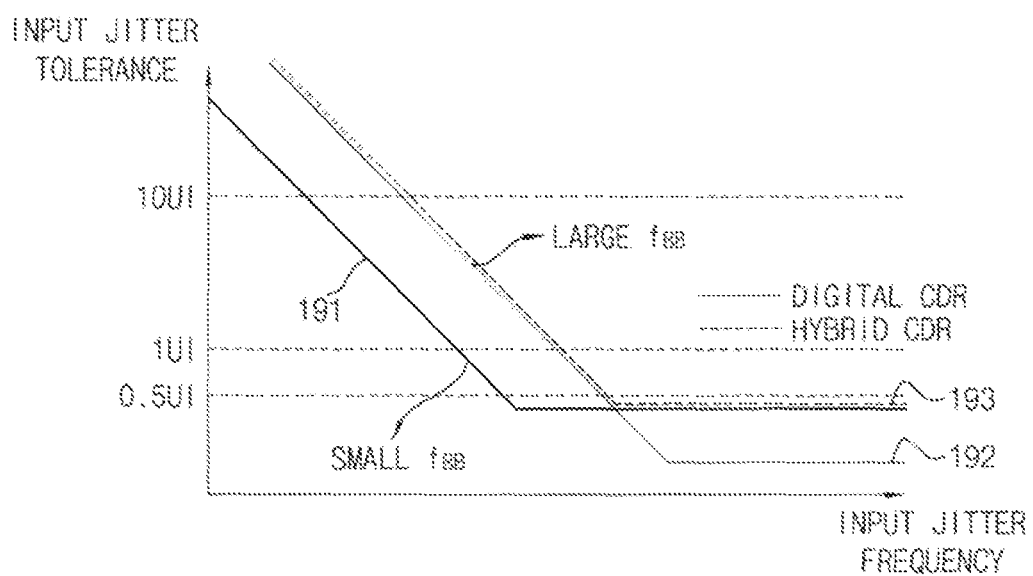
FIG. 14 graphically illustrates input jitter tolerances over input jitter frequencies of a conventional digital clock data recovery circuit and a hybrid clock data recovery circuit according to example embodiments of the inventive concept.

FIG. 14 is a graph illustrating input jitter tolerances over input jitter frequencies of a conventional digital clock data recovery circuit and a hybrid clock data recovery circuit according to example embodiments of the inventive concept.

In FIG. 14, a solid line 191 represents an input jitter tolerance over an input jitter frequency in a conventional digital clock data recovery circuit having a small proportional path frequency change amount $f_{BB}$, and a solid line 192 represents an input jitter tolerance over an input jitter frequency in a conventional digital clock data recovery circuit having a large proportional path frequency change amount $f_{BB}$. A dashed line 193 represents an input jitter tolerance over an input jitter frequency in a hybrid clock data recovery circuit according to example embodiments having the large proportional path frequency change amount $f_{BB}$. Referring to FIG. 14, it can be shown that, even if the hybrid clock data recovery circuit according to example embodiments of the inventive concept has the large proportional path frequency change amount $f_{BB}$, the input jitter tolerance of the hybrid clock data recovery circuit may not be reduced, and in particular the high-frequency jitter tolerance may not be reduced.

Figure 15:
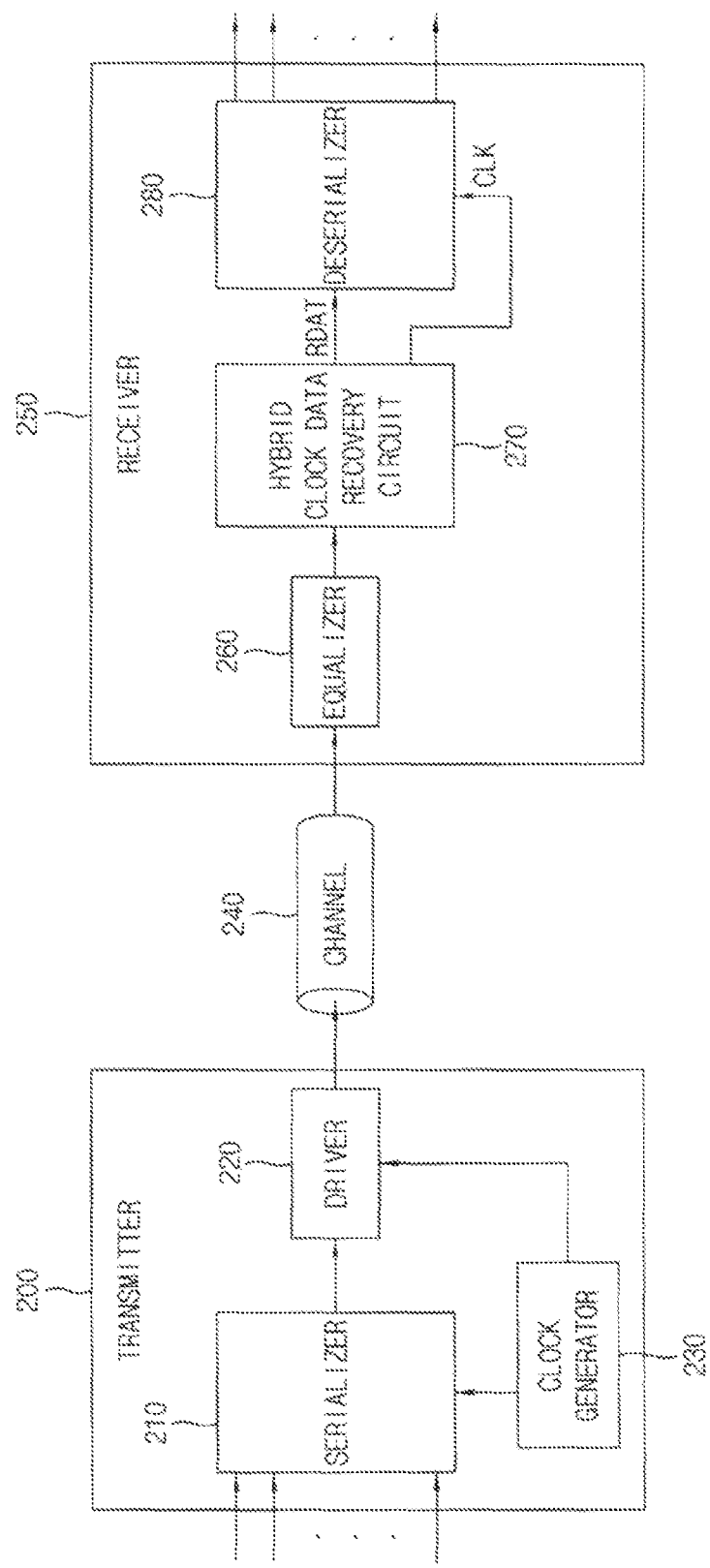
FIG. 15 is a block diagram illustrating a transmitter, and a receiver including a hybrid clock data recovery circuit according to example embodiments of the inventive concept.

FIG. 15 is a block diagram illustrating a transmitter, and a receiver including a hybrid clock data recovery circuit according to example embodiments of the inventive concept.

Referring to FIG. 15, a transmitter 200 may transmit an input data signal to a receiver 250 through a communication channel 240. The transmitter 200 may include a clock generator (e.g., a phase locked loop circuit) 230 that generates a clock signal, and a driver 220 that transmits the input data signal through the communication channel 240 in response to the clock signal generated by the clock generator 230. In some example embodiments, the transmitter 200 may further include a serializer 210, and the input data signal transmitted by the driver 220 may be a signal serialized by the serializer 210.

The receiver 250 may include a hybrid clock data recovery circuit 270 that generate a clock signal CLK and a recovered data signal RDAT based on the input data signal received through the communication channel 240. The hybrid clock data recovery circuit 270 may be a hybrid clock data recovery circuit 100 of FIG. 1. The hybrid clock data recovery circuit 270 may have a low circuit complexity and a small circuit size by employing a digital bang-bang type integral path, and may further have linearity by employing an analog linear type proportional path, thereby enhancing a jitter performance or a jitter tolerance.

In some example embodiments of the inventive concept, the communication channel 240 may be a serial communication channel, the input data signal may be a serial input data signal, and the recovered data signal RDAT may be a serial recovered data signal. In this case, the receiver 250 may further include a deserializer 280 that deserializer the serial recovered data signal RDAT generated by the hybrid clock data recovery circuit 270 based on the clock signal CLK generated by the hybrid clock data recovery circuit 270. In some example embodiments, the receiver 250 may further include an equalizer 260 that performs an equalization operation on the input data signal received through the communication channel 240.

According to example embodiments of the inventive concept, the communication channel 240 may be any communication channel, such as, for example, an Ethernet, a peripheral component interconnect express (PCI-e), a serial advance technology attachment (SATA), a universal serial bus (USB), a DisplayPort (DP), etc., and the receiver 250 may be any receiver of the Ethernet, PCI-e, SATA, USB, DP, etc.

The inventive concepts disclosed herein may be applied to any clock data recovery circuit and a receiver. For example, the inventive concepts may be applied to an Ethernet receiver, a PCI-e receiver, a SATA receiver, a USB receiver, a DP receiver, etc.

Figure 16B:
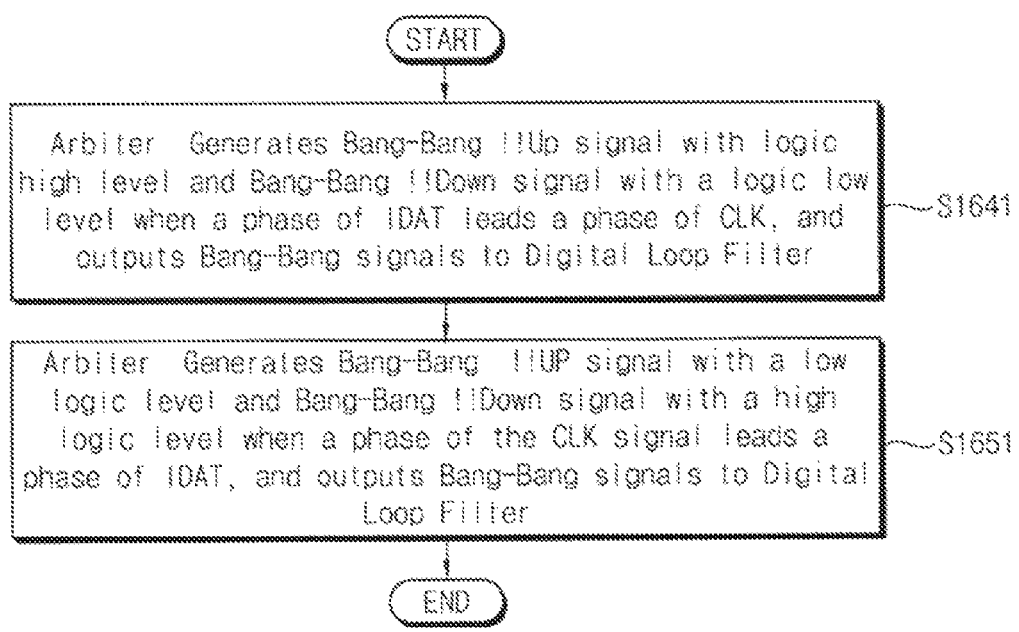

FIGS. 16A and 16B are flowcharts illustrating operation of an embodiment of the inventive concept. Examples of the linear phase detector, the arbiter, the digital loop filter and the digitally controlled oscillator are shown in FIG. 1. More particularly, the linear phase detector may have the exemplary construction as shown in FIG. 2 or 5, the arbiter may have the exemplary construction as shown in FIG. 3. In addition, the digital loop filter may have the construction shown in FIG. 7, and the digitally controlled oscillator may have the construction as shown in the examples in FIGS. 9, 10 and 11. However, an artisan should understand and appreciate that the inventive concept is not limited to the exemplary constructions shown herein.

At operation S1610, the linear phase detector 110 receives the input data signal IDAT and the clock signal CLK (shown in FIG. 1). The linear phase detector samples the input signal and generates a recovered data signal RDAT. The linear phase detector also generates an up signal and a down signal with a pulse width linearly proportional to a phase difference between the input data signal IDAT and the clock signal CLK.

At operation 1620, the linear phase detector outputs the up and down signals that are respectively provided to an arbiter over an integral path, and also provides the up and down signals to a digitally controlled oscillator over a proportional path. The components in the integral path operate digitally, whereas the frequency control of the clock signal via the proportional path 150 is performed as in an analog linear operation.

At operation S1630, the arbiter compares a phase of the input data IDAT and the clock, and it is determined whether the phase of IDAT leads a phase of the clock signal. If a phase of the IDAT does not lead a phase of the clock signal, then the phase of the clock signal may lead the phase of IDAT. The arbiter generates a bang-bang !!UP and bang-bang !!Down signals to indicate which phase (IDAT or clock signal) is leading.

At operation S1640, a bang-bang !!UP signal is generated that indicates that a phase of the input signal IDAT is leading. However, if at operation S1630 it was determined that the phase of the IDAT does not lead the phase of the clock signal, then at operation S1650 a bang-bang !!Down signal is generated that indicates the phase of the clock signal leads the phase of the input signal data IDAT.

At operation S1660, the Digital Loop Filter generates a digital control code based on the bang-bang signals received from the Arbiter.

At operation S1670, the Digitally Controlled Oscillator sets a frequency of the clock signal in response to the digital control code received from the Digital Loop Filter, and based on the up and down signals received from the linear phase detector over the proportional path, and the digitally controlled oscillator adjusts the frequency of the clock signals. FIGS. 4 and 6, for example, show some non-limiting ways that the clock frequency may be adjusted.

FIG. 16B provides additional detail with regard to how the arbiter may generate levels of bang-bang signals in accordance with operation S1640 and S1650 shown in FIG. 16A.

At operation S1641, the arbiter generates bang-bang !!UP signals with a logic high level and bang-bang !!Down signals with a logic low level when a phase of IDAT leads a phase of the clock signal, and outputs the bang-bang signals to the Digital Loop Filter.

In addition, at operation S1651, the arbiter generates bang-bang !!UP signals with a logic low level and bang-bang !!Down signals with a logic high level when a phase of the clock signal leads a phase of the input data IDAT, outputs the bang-bang signals to the Digital Loop Filter.

The digital loop filter, as discussed herein above, generates the digital control code that is output to the digitally controlled oscillator. The digitally controlled oscillator may the digitally controlled oscillator adjusts the phase of the clock signal in linear proportion to the phase difference between the input data signal and the clock signal by adjusting the frequency of the clock signal in response to the up and down signals. As discussed herein above, the digitally controlled oscillator may change the frequency of the clock signal by a proportional path frequency change amount for a time period corresponding to the pulse width difference between the up and down signals.

The foregoing is illustrative of example embodiments of the inventive concept and is not to be construed as limiting thereof. Although a few example embodiments have been described, those skilled in the art will readily appreciate that many modifications are possible in the example embodiments without materially departing from the present inventive concept. Accordingly, all such modifications are intended to be included within the scope of the present inventive concept as defined in the claims. Therefore, it is to be understood by a person of ordinary skill in the art that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A hybrid clock data recovery circuit comprising:
    a linear phase detector configured to generate a recovered data signal by sampling an input data signal in response to a clock signal, and to generate up and down signals having a pulse width difference that is linearly proportional to a phase difference between the input data signal and the clock signal;
    an arbiter that receives the up and down signals generated by the linear phase detector and in response is configured to generate a bang-bang up signal representing that a phase of the input data signal leads a phase of the clock signal and a bang-bang down signal representing that the phase of the clock signal leads the phase of the input data signal based on the up and down signals;
    a digital loop filter configured to generate a digital control code based on the bang-bang up signal and the bang-bang down signal received from the arbiter; and
    a digitally controlled oscillator configured to set a frequency of the clock signal in response to the digital control code, and to adjust the frequency of the clock signal in response to the up and down signals.

2. The hybrid clock data recovery circuit of claim 1, wherein the digitally controlled oscillator adjusts the phase of the clock signal in linear proportion to the phase difference between the input data signal and the clock signal by adjusting the frequency of the clock signal in response to the up and down signals.

3. The hybrid clock data recovery circuit of claim 1, wherein the linear phase detector includes a flip-flop that samples the input data in response to the clock signal and outputs the sampled input data as the recovered data signal.

4. The hybrid clock data recovery circuit of claim 1, wherein the linear phase detector generates the up and down signals to have falling edges coinciding with a falling edge of the clock signal, and rising edges of the up and down signals to have a phase difference corresponding to the phase difference between the input data signal and the clock signal.

5. The hybrid clock data recovery circuit of claim 4, wherein the linear phase detector generates the recovered data signal by sampling the input data signal at the falling edge of the clock signal.

6. The hybrid clock data recovery circuit of claim 1, wherein the linear phase detector comprises:
    a first flip-flop configured to sample and output the input data signal at a falling edge of the clock signal;
    a delayer that receives the input data signal and is configured to delay an output of the input data signal;

a second flip-flop configured to sample and output an output signal of the delayer at a rising edge of the clock signal;

a third flip-flop configured to sample and output an output signal of the first flip-flop at the rising edge of the clock signal;

a first XOR gate configured to generate the up signal by performing an XOR operation on the output signal of the delayer and an output signal of the second flip-flop; and a second XOR gate configured to generate the down signal by performing an XOR operation on the output signal of the first flip-flop and an output signal of the third flip-flop.

7. The hybrid clock data recovery circuit of claim 6, wherein the linear phase detector outputs the output signal of the first flip-flop as the recovered data signal.

8. The hybrid clock data recovery circuit of claim 1, wherein the linear phase detector generates the up and down signals to have rising edges coinciding with a rising edge of the clock signal, and falling edges of the up and down signals have a phase difference corresponding to the phase difference between the input data signal and the clock signal.

9. The hybrid clock data recovery circuit of claim 1, wherein the arbiter generates the bang-bang up signal having a logic high level and the bang-bang down signal having a logic low level while the up signal has a pulse width wider than the down signal, and generates the bang-bang up signal having the logic low level and the bang-bang down signal having the logic high level while the down signal has a pulse width wider than the up signal.

10. The hybrid clock data recovery circuit of claim 1, wherein the arbiter comprises:
a first NAND gate configured to perform a NAND operation on the up signal and an output signal of a second NAND gate;
the second NAND gate configured to perform a NAND operation on the down signal and an output signal of the first NAND gate;
a third NAND gate configured to generate the bang-bang up signal by performing a NAND operation on the output signal of the first NAND gate and an output signal of a fourth NAND gate; and
the fourth NAND gate configured to generate the bang-bang down signal by performing a NAND operation on the output signal of the second NAND gate and an output signal of the third NAND gate.

11. The hybrid clock data recovery circuit of claim 1, wherein the digital loop filter generates the digital control code by digitally filtering the bang-bang up signal and the bang-bang down signal.

12. The hybrid clock data recovery circuit of claim 1, wherein the digitally controlled oscillator changes the frequency of the clock signal by a proportional path frequency change amount for a time period corresponding to the pulse width difference between the up and down signals.

13. The hybrid clock data recovery circuit of claim 12, wherein the digitally controlled oscillator increases the frequency of the clock signal by the proportional path frequency change amount for the time period corresponding to the pulse width difference between the up and down signals if the up signal has a pulse width that is wider than the down signal, and decreases the frequency of the clock signal by the proportional path frequency change amount for the time period corresponding to the pulse width difference between the up and down signals if the down signal has a pulse width that is wider than the up signal.

14. A receiver comprising:
a hybrid clock data recovery circuit configured to generate a clock signal and a recovered data signal based on an input data signal received through a communication channel, the hybrid clock data recovery circuit comprising:
a linear phase detector configured to generate the recovered data signal by sampling the input data signal in response to the clock signal, and to generate up and down signals having a pulse width difference that is linearly proportional to a phase difference between the input data signal and the clock signal;
an arbiter that receives the up and down signals generated by the linear phase detector and in response is configured to generate a bang-bang up signal representing that a phase of the input data signal leads a phase of the clock signal and a bang-bang down signal representing that the phase of the clock signal leads the phase of the input data signal based on the up and down signals;
a digital loop filter coupled to the arbiter and configured to generate a digital control code based on the bang-bang up signal and the bang-bang down signal; and
a digitally controlled oscillator configured to set a frequency of the clock signal in response to the digital control code, and to adjust the frequency of the clock signal in response to the up and down signals.

15. A hybrid clock data recovery circuit comprising:
a linear phase detector configured to generate a recovered data signal by sampling an input data signal in response to a clock signal, and to generate up and down signals having a pulse width difference that is linearly proportional to a phase difference between the input data signal and the clock signal;
an arbiter that receives the up and down signals along an integral path of the hybrid clock data recovery circuit and is configured to generate a bang-bang up signal and a bang-bang down signal;
a digital loop filter that receives the bang-bang up signal and the bang-bang down signal from the arbiter along the integral path and generates a digital control code; and
a digitally controlled oscillator that receives the digital control code from the digital loop filter along the integral path, and receives the up and down signals from the linear phase detector along a proportional path, wherein the digitally controlled oscillator generates an adjusted clock signal having a frequency adjusted to the up and down signals received from the linear phase detector.

16. The hybrid clock data recovery circuit of claim 15, wherein the digitally controlled oscillator generates the adjusted clock signal to have an increased frequency when a value of the digital control code increases by a unit amount, and generates the adjusted clock signal having a decreased frequency when the value of the digital control code decreases by the unit amount.

17. The hybrid clock data recovery circuit of claim 15, wherein the digitally controlled oscillator increases a frequency of the clock signal from a default frequency f0 by an integral path frequency unit change amount $\alpha$ in response to the digital control code being increased by a unit amount.

18. The hybrid clock data recovery circuit of claim 17, wherein the digitally controlled oscillator increases the frequency of the clock signal by a proportional path frequency change amount $f_{BB}$ in response to the up signal having a logic high level and the down signal having a logic low level.

19. The hybrid clock data recovery circuit of claim 15, wherein the integral path comprises a digital signal path.

20. The hybrid clock data recovery circuit of claim 15, wherein the proportional path comprises an analog signal path.

* * * * *